(12) United States Patent
Nii

(10) Patent No.: US 6,566,713 B2
(45) Date of Patent: May 20, 2003

(54) SEMICONDUCTOR DEVICE AND MANUFACTURING METHOD THEREOF

(75) Inventor: Hideaki Nii, Yokohama (JP)

(73) Assignee: Kabushiki Kaisha Toshiba, Tokyo-To (JP)

( * ) Notice: Subject to any disclaimer, the term of this patent is extended or adjusted under 35 U.S.C. 154(b) by 0 days.

(21) Appl. No.: 09/963,426

(22) Filed: Sep. 27, 2001

(65) Prior Publication Data

US 2002/0036321 A1 Mar. 28, 2002

(30) Foreign Application Priority Data

Sep. 27, 2000 (JP) ........................................ 2000-294966

(51) Int. Cl.$^7$ .................... H01L 27/01; H01L 27/12; H01L 31/0392
(52) U.S. Cl. .................... 257/347; 257/350; 257/351
(58) Field of Search ................... 257/347, 348, 257/349, 350, 351, 352–354; 438/149, 151–154, 479

(56) References Cited

U.S. PATENT DOCUMENTS

| | | | |
|---|---|---|---|
| 5,751,041 A | | 5/1998 | Suzuki et al. ............... 257/357 |
| 5,929,488 A | * | 7/1999 | Endou .......................... 257/347 |
| 6,100,567 A | * | 8/2000 | Burr ............................ 257/347 |
| 6,118,152 A | * | 9/2000 | Yamaguchi et al. ........ 257/347 |
| 6,121,661 A | * | 9/2000 | Assaderaghi et al. ...... 257/104 |

FOREIGN PATENT DOCUMENTS

| | | |
|---|---|---|
| JP | 07-176751 | 7/1995 |
| JP | 2000-156408 | 6/2000 |
| JP | 2000-243967 | 9/2000 |

\* cited by examiner

*Primary Examiner*—Shouxiang Hu
(74) *Attorney, Agent, or Firm*—Oblon, Spivak, McClelland, Maier & Neustadt, P.C.

(57) ABSTRACT

A semiconductor device comprises an SOI substrate formed with a mono-crystalline semiconductor layer through an embedded insulating layer on a first conductivity type semiconductor substrate; a MIS type field-effect transistor provided within a device region defined by isolating said mono-crystalline semiconductor layer with a device isolation region and having a gate electrode; an opening formed penetrating said device isolation region and said embedded insulating layer and reaching said semiconductor substrate; and a substrate electrode provided covering said opening and taken out up to the surface flush with said gate electrode. And a method of manufacturing a semiconductor device, comprises providing a device isolation region for defining a device region on a mono-crystalline semiconductor layer of an SOI substrate formed with a mono-crystalline semiconductor layer through an embedded insulation payer on a semiconductor substrate of a first conductivity type; forming an opening penetrating said device isolation region and said embedded insulation layer and reaching said semiconductor substrate; depositing polysilicon on said SOI substrate and within said opening and providing a gate electrode and a substrate electrode of said MIS type field-effect transistor by executing the patterning thereon; and implanting impurities into said gate electrode and said substrate electrode.

6 Claims, 13 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2000-294966, filed on Sep. 27, 2000; the entire contents of which are incorporated herein by reference.

BACKGROUND OF THE INVENTION

The present invention relates to a semiconductor device and a manufacturing method thereof, and more particularly to a structure of a MIS type integrated circuit on an SOI substrate and a manufacturing method thereof.

It has become an important target over the recent years to decrease a consumption of the electric power of an LSI, and a MIS type transistor using an SOI (Silicon On Insulator) substrate has been increasingly developed as one of effective solving methods.

FIGS. 11A through 11G are sectional views showing manufacturing steps of a method of manufacturing the conventional MIS type transistor provided on the SOI substrate.

To start with, as shown in FIG. 11A, an SOI substrate is composed of a silicon substrate 1, an embedded oxide layer 2 and a mono-crystalline layer. On this SOI substrate, a device isolation is carried out by a STI (Shallow Trench Isolation) device isolation method based on a normally used shallow trench, and the isolation is done with a isolation region 5 embedded with an oxide layer, thereby providing a device region 3 of which the surface is covered with a thermal oxide layer 4.

Next, as shown in FIG. 11B, an NMOS channel region 6 is provided by implanting ions of a p-type impurities into the device region 3, and a PMOS channel region 7 is provided by implanting ions of an n-type impurities into the device region 3 by making use of resist patterning based on photolithography.

Subsequently, as shown in FIG. 11C, after removing the oxide layer 4 on the device regions 6, 7, a gate insulation layer 8 is provided by performing again the thermal oxidation. Thereafter, undoped polysilicon is deposited over the entire surface by use of an LPCVD method, and gate electrodes 9, 10 are provided on an NMOS channel region 6 and a PMOS channel region 7 by using the resist patterning and reactive ion etching (RIE).

Next, as shown in FIG. 11D, a low concentration diffused layer 11 is provided in the NMOS region by implanting the ions of n-type impurities, and a low concentration diffused layer 12 is provided in the PMOS region by implanting the ions of p-type impurities by using the resist patterning(not shown) and the gate electrodes 9, 10 as ion implantation masks.

Next, as shown in FIG. 11E, a nitride layer is deposited by using the LPCVD method, and thereafter a side wall 13 is provided on side surfaces of the gate electrodes 9, 10 by effecting the RIE. Further, a high concentration diffused layer 14 is provided in the NMOS region by implanting the ions of the n-type impurities, and a high concentration diffused layer 15 is provided in the PMOS region by implanting the ions of the p-type impurities by making the use of the resist patterning (not shwon). The ion implantation for providing these high concentration diffused layers 14, 15 also functions to add the impurities to the gate electrodes 9, 10 at the same time. That is, the gate electrode 9 becomes an n-type gate electrode, and the gate electrode 10 becomes a p-type gate electrode. Thereafter, a refractory metal such as Co, Ti, Ni is deposited on an entire wafer surface, and the thermal process is executed thereon, thereby providing a metal silicide 16 selectively on only the region where the silicon of the MIS type transistor is exposed.

Subsequently, as shown in FIG. 11F, after an oxide layer 17 serving as an inter-layer insulating layer has been deposited, a contact hole 18 to the NMOS, a contact hole 19 to PMOS and a contact hole 20 to the a silicon substrate 1 are respectively formed by the resist patterning based on the photolithography and by the RIE. The contact hole is formed deeper by thickness of the embedded oxide layer 2 and thickness of the isolation region 5 than the contact holes 18, 19.

Further, a high concentration impurity layer 21 having the same conductivity as that of the silicon substrate 1 is provided at the bottom of the contact hole 20 by effecting the resist patterning and the ion implantation, and thereafter the thermal process executed thereon, thereby activating the impurity layer 21. Note that this contact hole 20 is used for stabilizing an electric potential of the silicon substrate 1, and the high concentration impurity layer 21 is provided to ensure an ohmic contact between an interconnection metal formed subsequently and the silicon substrate 1.

Thereafter, a metal 22 of Ti/TiN etc is deposited thin within the contact holes 18, 19, 20, and a metal 23 such as tungsten (W) etc is grown with the metal 22 used as a base, and polishing is executed, whereby the metals 22, 23 are left only within the contact holes. Further, after the metal interconnections of Al etc has been deposited on the entire wafer surface, a predetermined metal interconnection 24 is formed by effecting the resist patterning and the RIE.

Thus, according to the conventional semiconductor device, the MIS type transistor is provided and the inter-layer insulation layer is deposited. Thereafter, when forming the contact hole with respect to each of the electrodes to the transistor, the contact holes are so opened as to penetrate the inter-layer insulation layer, the device isolation oxide layer and the embedded oxide layer at the same time, and the metal interconnection is provided as in the case of other contacts, thereby making an electric connection to the silicon substrate. Accordingly, in the semiconductor device manufactured by using the present method, the circuit using the MIS type transistor can be provided on the SOI substrate, which largely contributes to decrease the consumption of the electric power of the LSI.

There arise, however, the following problems inherent in the conventional semiconductor device and the manufacturing method thereof described above.

First, it is desirable that the metal interconnection for stabilizing the electric potential of the silicon substrate be, when forming this metal interconnection, taken from the underside of the substrate, however, there is no alternative but to often take it out from the surface of the substrate as the case may be. In this case, as shown in FIG. 11F, the contact hole 20 to the silicon substrate is formed deeper by the thickness of the device isolation oxide layer plus the embedded oxide layer than other contact holes 18, 19, and hence an aspect ratio increases, with the result that it is difficult to form a minute hole corresponding to a design rule.

Second, even when forming the contact hole, it is quite difficult to grow a base metal thin layer for growing tungsten uniformly up to side and bottom portions of the hole having a high aspect ratio as in the case of the contact hole 20.

Third, it is required for ensuring the ohmic contact with respect to the silicon substrate that the high concentration impurity layer 21 be provided at the bottom of the contact hole 20. If the impurity layer formed by executing the ion implantation is activated at a temperature as high as, e.g., 950° CRTA after the contact hole 20 has been formed, however, the metal silicide already provided on the MIS type transistor is weak to the heat and decline in its characteristic. This results in a problem that a junction leak is brought about, and a resistance rate rises.

As described above, in the semiconductor device manufactured by using the conventional technology, it is difficult to stably form the contact hole to the silicon substrate constituting the SOI substrate.

SUMMARY OF THE INVENTION

A semiconductor device according to an embodiment of the present invention comprises an SOI substrate formed with a mono-crystalline semiconductor layer through an embedded insulating layer on a first conductivity type semiconductor substrate; a MIS type field-effect transistor provided within a device region defined by isolating said mono-crystalline semiconductor layer with a device isolation region and having a gate electrode; an opening formed penetrating said device isolation region and said embedded insulating layer and reaching said semiconductor substrate; and a substrate electrode provided covering said opening and taken out up to the surface flush with said gate electrode.

A semiconductor device according to another embodiment of the present invention comprises: an SOI substrate configured by providing a mono-crystalline semiconductor layer through an embedded insulation layer on a first conductivity type semiconductor substrate of which the surface is provided with a first impurity diffused layer of the first conductivity type and a second impurity diffused layer of the second conductivity type; a MIS field-effect transistor provided within a device region defined by isolating said mono-crystalline semiconductor layer with a device isolation region, and having a gate electrode;

first and second openings penetrating said device isolation region and said embedded insulation layer and reaching said first impurity diffused layer of said semiconductor substrate; third and fourth openings penetrating said device isolation region and said embedded insulation layer and reaching said second impurity diffused layer of said semiconductor substrate; first and fourth polysilicon substrate electrodes of the first conductivity type, taking such a configuration as to fill and cover said first and fourth openings, and taken out up to the surface flush with said gate electrode; and second and third polysilicon substrate electrodes of the second conductivity type, taking such a configuration as to fill and cover said second and third openings, and taken out up to the surface flush with said gate electrode, wherein first and second diodes for an electrostatic protection are composed respectively of a group of said first polysilicon electrode, said first impurity diffused layer and said second polysilicon electrode, and a group of said third polysilicon electrode, said second impurity diffused layer and said fourth polysilicon electrode.

A method for manufacturing semiconductor device according to an embodiment of the present invention comprises: providing a device isolation region for defining a device region on a mono-crystalline semiconductor layer of an SOI substrate formed with a mono-crystalline semiconductor layer through an embedded insulation payer on a semiconductor substrate of a first conductivity type; forming an opening penetrating said device isolation region and said embedded insulation layer and reaching said semiconductor substrate; depositing polysilicon on said SOI substrate and within said opening and providing a gate electrode and a substrate electrode of said MIS type field-effect transistor by executing the patterning thereon; and implanting impurities into said gate electrode and said substrate electrode.

A method for manufacturing semiconductor device according to another embodiment of the present invention comprises: providing a device isolation region for defining a device region on a mono-crystalline semiconductor layer of an SOI substrate formed with a mono-crystalline semiconductor layer through an embedded insulation payer on a semiconductor substrate of a first conductivity type; providing a first polysilicon layer on the entire surface; forming an opening penetrating said first polysilicon layer, said device isolation region and said embedded insulation layer and reaching said semiconductor substrate;

providing a second polysilicon layer on the entire surface to cover said opening; providing a substrate electrode by patterning said first and second polysilicon layers; and implanting an impurity into said substrate electrode.

BRIEF DESCRIPTON OF THE DRAWINGS

DETAILED DESCRIPTION OF THE INVENTION

A semiconductor device and a manufacturing method thereof according to the present invention will hereinafter be described with reference to the accompanying drawings.

(First Embodiment)

Figure 1A:
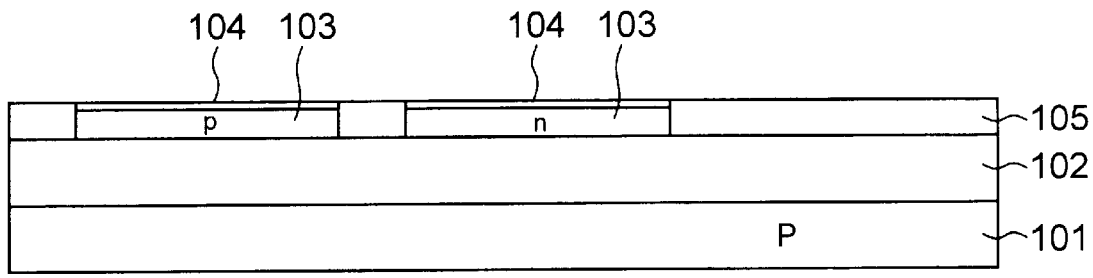
FIGS. 1A through 1J are sectional views showing respective steps of manufacturing a MIS type integrated circuit in a first embodiment of the present invention.
Figure 1B:
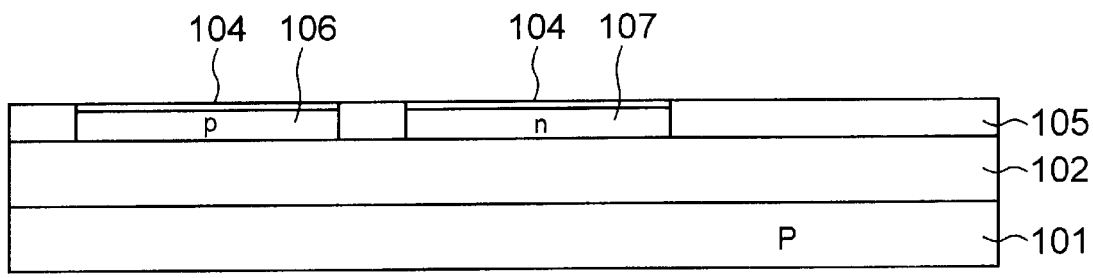
Figure 1C:
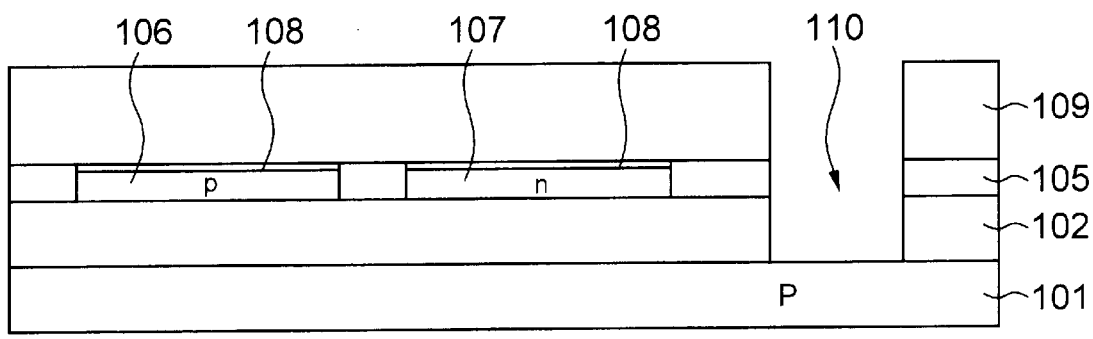
Figure 1D:
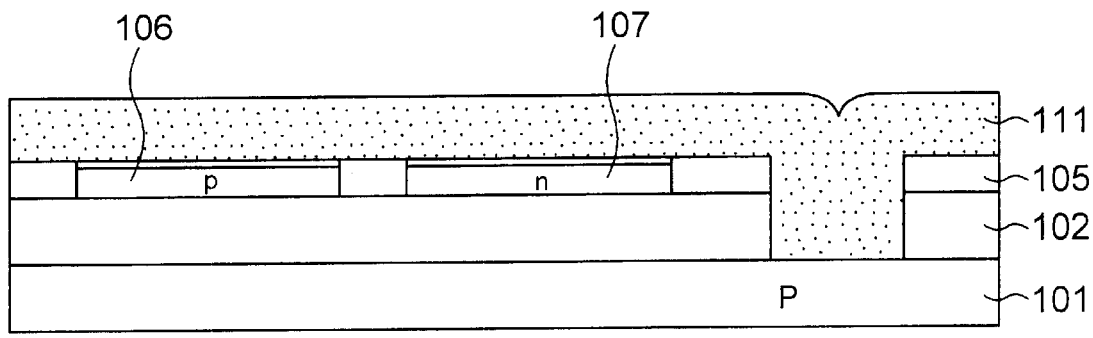
Figure 1E:
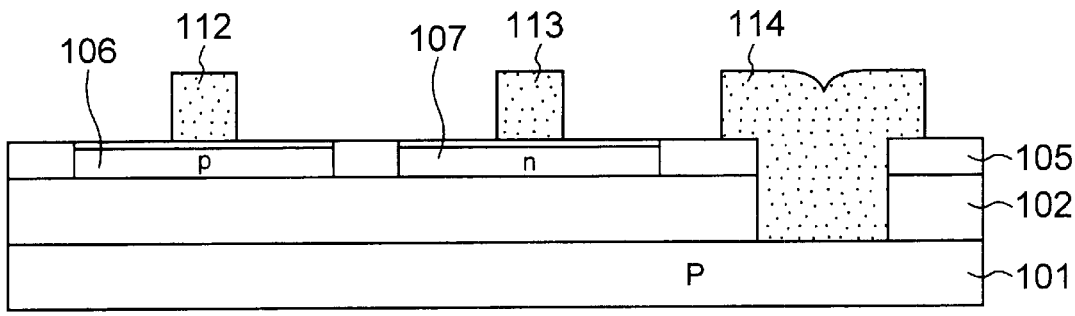
Figure 1F:
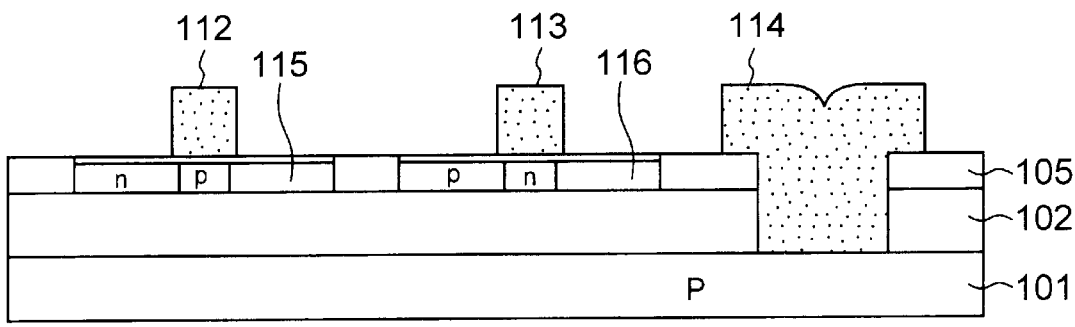
Figure 1G:
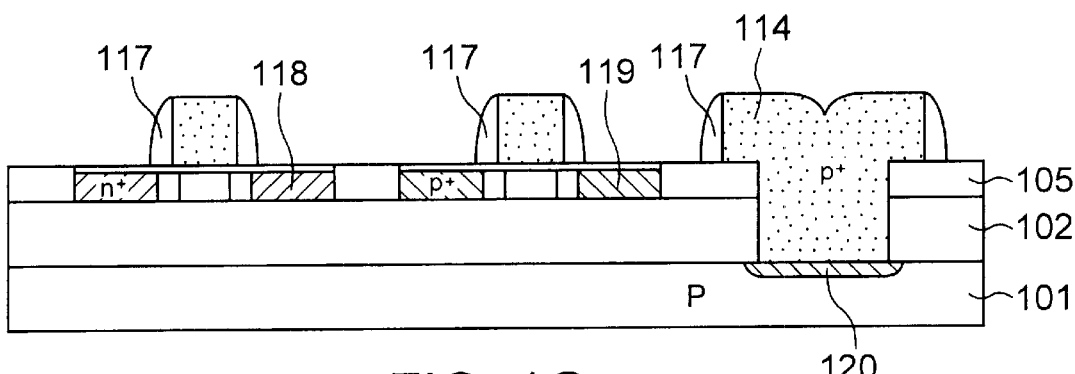
Figure 1H:
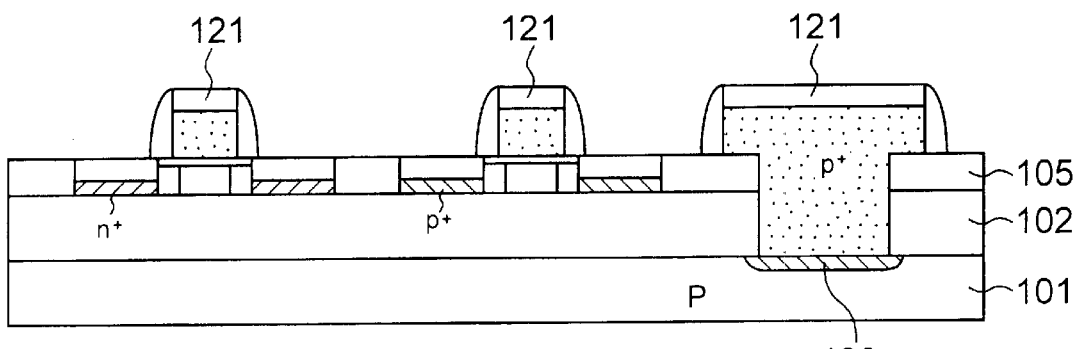
Figure 1:
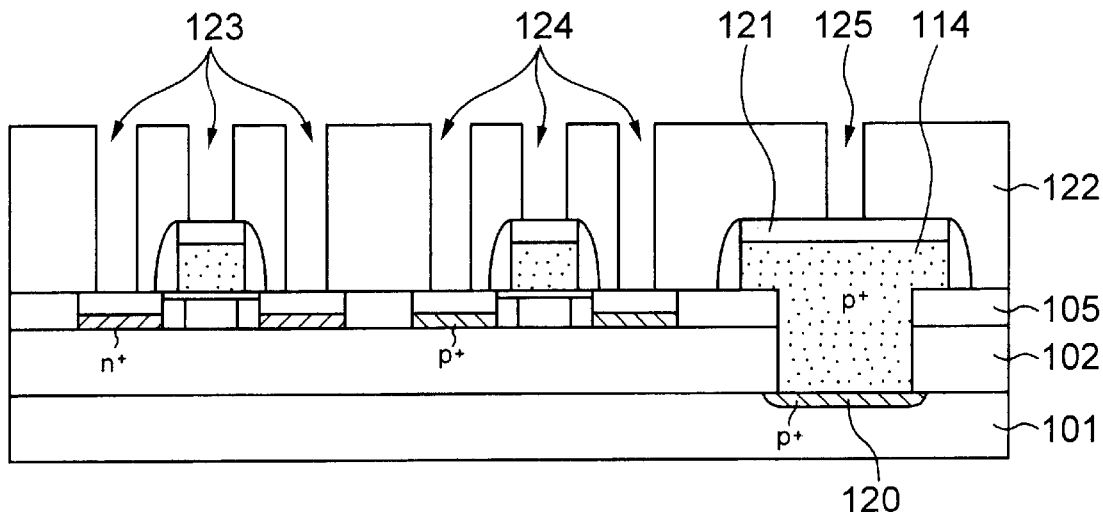
Figure 2A:
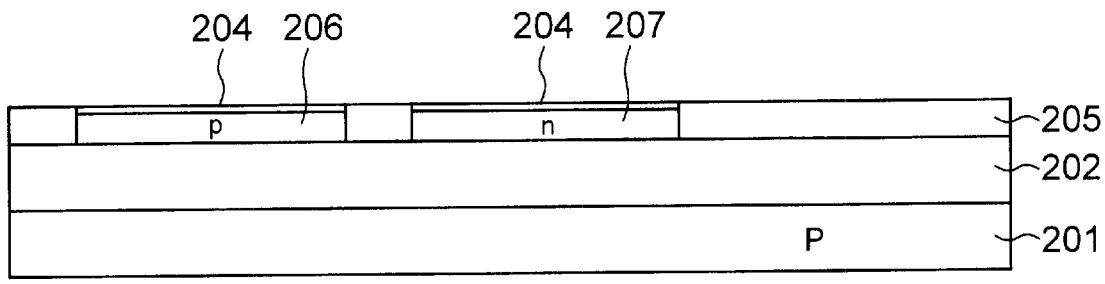
FIGS. 2A through 2C are sectional views showing a part of the steps of manufacturing the MIS type integrated circuit in a second embodiment of the present invention.
Figure 2B:
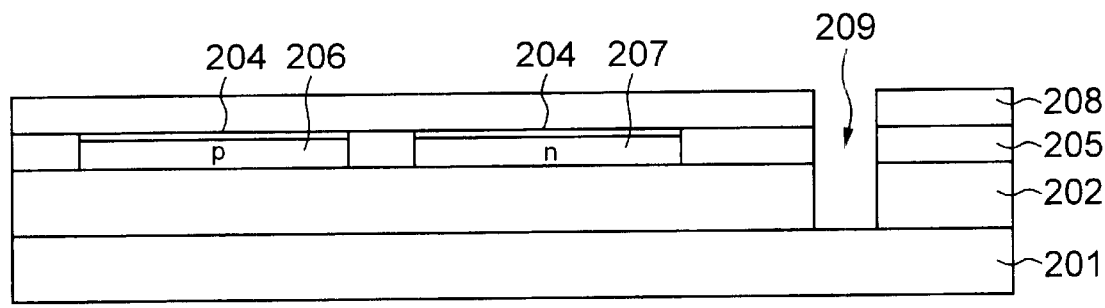
Figure 2C:
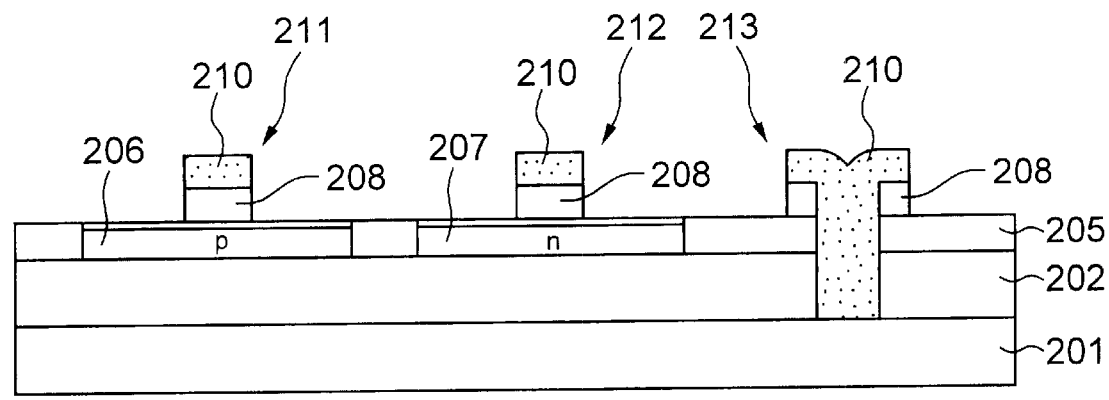
Figure 3:
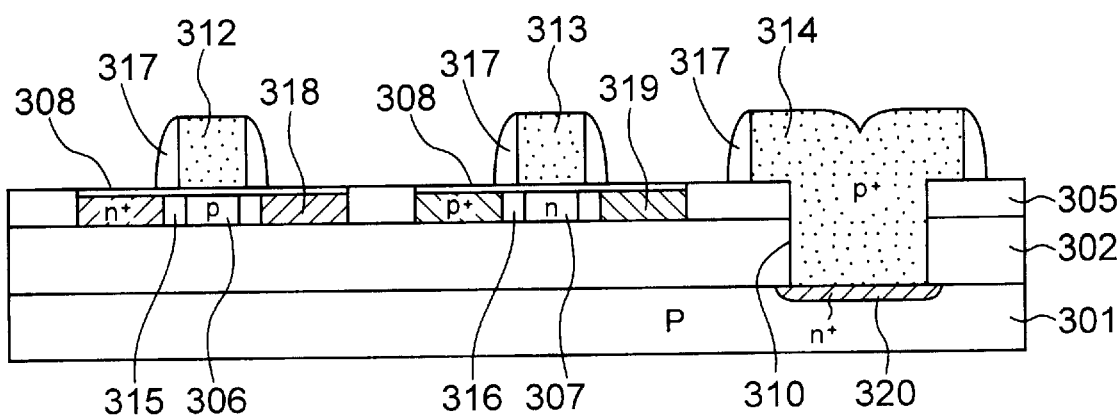
FIG. 3 is a sectional view showing one step of manufacturing the MIS type integrated circuit in a third embodiment of the present invention.

FIGS. 1 through 3 are explanatory sectional views showing respective manufacturing steps of a method of manufacturing a MIS type transistor provided on an SOI substrate in a first embodiment of the present invention.

To start with, as shown in FIG. 1A, an SOI substrate is configured by providing a mono-crystalline layer via an embedded oxide layer 102 on a p-type silicon substrate 101. A device region 103 of which the surface is covered with a thermal oxide layer 104 and a isolation region 105 embedded with an oxide layer, are formed by a device isolation involving the use of a normally-implemented STI (Shallow Trench Isolation) device isolation method.

Next, a resist is coated over the whole surface, and patterning is effected thereon by photolithography. Then, ions such as p-type impurities are implanted into an NMOS-sided device region, thereby providing an NMOS channel region 106. The same resist patterning is again effected, and ions such as n-type impurities are implanted into a PMOS-sided device region, thereby providing a PMOS channel region 107 (FIG. 1B).

Subsequently, after removing the thermal oxide layer 104, and, as shown in FIG. 1C, the thermal oxide layer 104 is exfoliated. Thereafter, a gate insulation layer 108 is provided by thermal oxidation on the channel regions 106, 107, and then a resist 109 is coated and is subjected to patterning to remove an opening formation planning area. An opening 110 is formed to penetrate the embedded oxide layer 102 and the device isolation oxide layer 105 as well by HF-series wet etching or reactive ion etching (RIE).

Next, as shown in FIG. 1D, after peeling off the resist, an undoped polysilicon 111 is deposited by use of an LPCVD (Low Pressure Chemical Vapor Deposition) method.

Subsequently, as shown in FIG. 1E, the resist is coated over the polysilicon layer 111 and subjected to patterning so that a region slightly wider than a gate electrode formation planning area and the opening 110 is left. With this resist used as an etching mask, the etching, i.e., the RIE is carried out, thereby providing a gate electrode 112 on the NMOS channel region 106 and a gate electrode 113 on the PMOS channel region 107. At the same time, a substrate electrode 114 taking a configuration covering the whole of the opening 110, is provided. An upper surface of the substrate electrode 114 is flush with upper surfaces of the gate electrodes 112, 113.

Next, the resist is coated over the entire surface, and this region is subjected to the patterning by photolithography, whereby the NMOS side is exposed. Then, the ions such as the n-type impurities are implanted, thereby providing an n-type low-concentration diffused layer 115 along the gate electrode 112 in the NMOS channel region 106. Subsequently, the PMOS side and the substrate electrode are exposed by executing again the same resist patterning. Then, the ions such as the p-type impurities are implanted, thereby providing a p-type low-concentration diffused layer 116 along the gate electrode 113 in the PMOS channel region 107 (FIG. 1F). Note that the ion implantation of the p-type impurities into the substrate electrode 114 is also carried out on this occasion.

Next, as shown in FIG. 1G, a nitride layer is deposited on the whole by use of the LPCVD method, and thereafter this region is etched back by the RIE, whereby a side wall 117 is provided on the side surfaces of the gate electrodes 112, 113 and of the substrate electrode 114.

Further, the resist patterning is executed to make the NMOS region exposed, and the ions of the n-type impurities are implanted, thereby providing a high-concentration diffused layer 118 serving as a source/drain on the NMOS region. Similarly, the PMOS region is exposed by the resist patterning, and the ions of the p-type impurities are implanted, thereby providing a high-concentration diffused layer 119 serving as a source/drain on the PMOS region. The ion implantation for providing the high-concentration diffused layers 118, 119 functions to simultaneously add the impurities to the gate electrodes 112, 113, whereby the gate electrode 112 becomes an n-type gate electrode while a gate electrode 113 becomes a p-type gate electrode. The ion implantation of the p-type impurities into the PMOS region is effected as well as into the substrate electrode 114 at the same time, so that the substrate electrode 114 becomes a high-concentration p-type polysilicon.

Thereafter, an RTA thermal process at temperature as high as, e.g., 950° C. is executed, thereby activating the impurities. At this time, the p-type impurities implanted into the substrate electrode 114 are diffused over within the p-type silicon substrate 101 by the thermal process, thereby providing a p-type high-concentration diffused layer 120. As a result, the electrode 114 is electrically connected to the p-type silicon substrate 101. Note that the impurities added to the electrode 114 are required to have the same conductivity as that of the impurities added to the silicon substrate 101 in order for the electrode 114 to electrically stabilize an electric potential of the silicon substrate 101.

Subsequently, as shown in FIG. 1H, a refractory metal such as Co, Ti, Ni is deposited on the entire wafer surface, and the thermal process is executed thereon, thereby providing a metal silicide 121 selectively on only the region where the silicon of the MIS type transistor is exposed and on the substrate electrode 114.

Next, as shown in FIG. 1I, after an oxide layer 122 serving as an inter-layer insulating layer has been deposited, a contact hole 123 to the NMOS, a contact hole 124 to the PMOS and a contact hole 125 to the substrate electrode 114 are respectively formed by the resist patterning based on the photolithography and by the RIE. Note that since the substrate electrode 114 is flush with the gate electrodes 112, 113, depths of the contact holes formed therein are the same, and an aspect ratio of the contact hole with respect to the substrate electrode 114 is not higher than others.

Figure 1J:
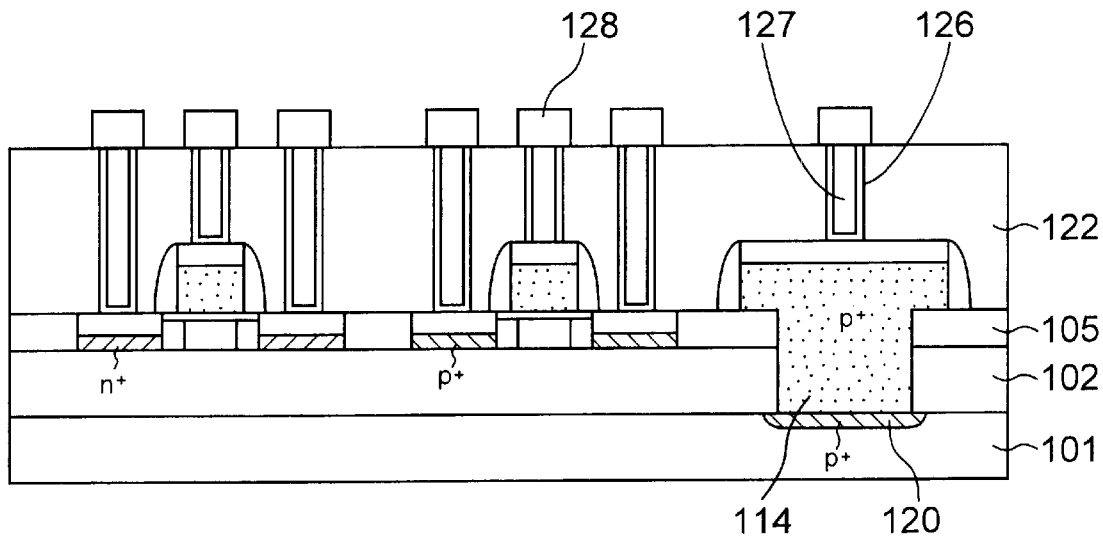

Thereafter, as shown in FIG. 1J, a metal 126 such as Ti/TiN etc is deposited thin into the contact holes 123, 124, 125, and, with the metal 126 serving as a base, a metal 127 such as W etc is grown. Then, only the metals 126, 127 are left in the contact holes by polishing. Further, a metal interconnection such as Al etc is deposited on the entire surface of a wafer, and thereafter the predetermined metal interconnection 127 is formed by the resist patterning and the RIE.

According to the manufacturing method and the semiconductor device manufactured by this method, the substrate electrode is provided simultaneously with the gate electrode so as to take out the substrate electrode up to the surface flush with the gate electrode. Hence, the depth of the contact hole for taking out the substrate potential is the same as that of the contact hole for the gate electrode, and the contact exhibiting a high reliability can be easily formed, whereby the electric potential can be stably taken for the silicon substrate.

(Second Embodiment)

FIGS. 2A through 2C are explanatory sectional views showing respective steps of manufacturing the MIS type transistor provided on the SOI substrate in a second embodiment of the present invention.

FIG. 2A corresponds to FIG. 1B in the first embodiment. To begin with, the SOI substrate is configured by providing the mono-crystalline layer via an embedded oxide layer 202 on a p-type silicon substrate 201. A p-type NMOS channel region 206 of which the surface is covered with a thermal oxide layer 204, an n-type PMOS channel region 207 and a isolation region 205 embedded with the oxide layer, are provided on this SOI substrate.

Subsequently, after peeling off the thermal oxide layer 204, a gate insulation layer 208 is provided, and an undoped polysilicon 209 is deposited by the LPCVD method. Thereafter, the resist is coated over the entire surface, and the resist patterning based on the photolithography is effected so that an opening is formed in only an area provided with the substrate electrode. Further, an opening 210 penetrating the device isolation oxide layer 205 and the embedded oxide layer 202 and reaching the silicon substrate 201, is formed by the RIE with this resist used as an etching mask.

Thereafter, a natural oxide layer on the surface of the silicon substrate at the bottom of the opening 210 is removed by use of a hydrogen fluoride (HF) series solution, and thereafter the undoped polysilicon 211 is deposited and embedded into the opening 210. Further, the resist is coated over the entire surface, and the patterning is effected so that only areas corresponding to the gate electrode and the substrate electrode. When performing the RIE with this resist used as an etching mask, the gate electrodes 212, 213 are provided on the NMOS channel region 206 and on the PMOS channel region 207. Simultaneously, a substrate electrode 214 is provided in a configuration covering entirely the opening 210.

Thereafter, the MIS semiconductor integrated circuit is manufactured by the steps subsequent to the step inclusive shown in FIG. 1F in the first embodiment.

According to the second embodiment, unlike the first embodiment, after removing the natural oxide layer existing at the bottom of the opening reaching the silicon substrate, the polysilicon can be deposited. Hence, an electric resistance between the polysilicon and the silicon substrate can be decreased.

Further, the opening is formed after depositing the undoped polysilicon, and therefore a possibility of an organic contamination to the gate insulation layer through the resist can be reduced.

According to the second embodiment also, the substrate electrode is flush with the gate electrode, and it is therefore feasible to easily form the highly reliable contacts and to take the electric potential for the silicon substrate with the stability.

(Third Embodiment)

FIG. 3 is an explanatory sectional view showing a MIS type transistor provided on the SOI substrate in a third embodiment of the present invention.

FIG. 3 is the sectional view corresponding to FIG. 1G in the first embodiment, showing the device, wherein 300's are given as the reference numerals.

In the third embodiment, the steps are the same as those shown in FIGS. 1A through 1E. Namely, the SOI substrate is configured by providing the mono-crystalline layer via an embedded oxide layer 302 on a p-type silicon substrate 301. A device region and a isolation region 305 embedded with an oxide layer are provided by executing the device isolation, which involves the use of the STI device isolation method. Then, the resist is covered over the entire surface, the patterning is effected thereon by the photolithography, and the ions such as the p-type impurities are implanted into the NPMS-sided device region, thereby providing an NMOS channel region 306. Then, the same resist patterning is again carried out, and the ions such as the n-type impurities are implanted into the PMOS-sided device region, thereby providing a PMOS channel region 307. Subsequently, after a gate insulation layer 308 has been provided by the thermal oxidation on the channel regions 306, 307, the patterning is effected to remove a resist opening formation planning area formed on the entire surface, thereby forming such an opening 310 for the substrate electrode as to penetrate the device isolation oxide layer 305 and the embedded oxide layer 302.

The undoped polysilicon is deposed on the whole surface by use of the LPCVD method and embedded into the opening 310, and is further deposited on the two channel regions. Then, the RIE is executed, wherein the etching mask is the resist subjected to the patterning so that there exists a region lightly wider than the gate electrode formation planning area and the opening 310. Gate electrodes 312, 313 are thus provided on the NMOS channel region 306 and on the PMOS channel region 307. At the same time, a substrate electrode 314 taking a configuration covering the whole of the opening 310 is provided. The upper surface of the substrate electrode 314 is flush with the upper surfaces of other gate electrodes 312, 313.

Next, the resist is coated over the entire surface, and this region is subjected to the patterning by photolithography, whereby the NMOS side and the substrate electrode 314 are exposed. Then, the ions such as the n-type impurities are implanted, thereby providing an n-type low-concentration diffused layer 315 along the gate electrode 312 in the NMOS channel region 306. Subsequently, the PMOS side is exposed by executing again the same resist patterning. Then, the ions such as the p-type impurities are implanted, thereby providing a p-type low-concentration diffused layer 316 along the gate electrode 313 in the PMOS channel region 307. Note that the ion implantation of the n-type impurities into the substrate electrode 314 is also carried out on this occasion. Next, the nitride layer is deposited on the whole by use of the LPCVD method, and thereafter this region is etched back by the RIE, whereby a side wall 317 is provided on the side surfaces of the gate electrodes 312, 313 and of the substrate electrode 314. Further, the resist patterning is executed to make the NMOS region and the substrate electrode 314 exposed, and the ions of the n-type impurities are implanted, thereby providing a high-concentration diffused layer 318 on the NMOS region. Similarly, the PMOS region is exposed by the resist patterning, and the ions of the p-type impurities are implanted, thereby providing a high-concentration diffused layer 319 on the PMOS region. The ion implantation for providing these high-concentration diffused layers 318, 319 functions to simultaneously add the impurities to the gate electrodes 312, 313, whereby the gate electrode 312 becomes an n-type gate electrode while a gate electrode 313 becomes a p-type gate electrode. The ion implantation of the n-type impurities into the NMOS region is effected as well as into the substrate electrode 314 at the same time, so that the substrate electrode 314 becomes a high-concentration n-type polysilicon. Thereafter, the n-type impurities in the substrate electrode 314 are diffused over within the silicon substrate 301 by executing the thermal process, thereby providing an n-type high-concentration diffused layer 320.

A conductivity type of the substrate electrode in the third embodiment is opposite to that in the first embodiment, and a depletion layer capacitance formed by the n-type high-concentration diffused layer 320 and the p-type silicon substrate 301, can be used as a passive device. Further, as in the first embodiment, the contact hole for taking out the substrate potential has the same depth as that of the contact hole to the gate electrode, and hence there can be exhibited effects in which the highly reliable contacts can be easily formed, and the electric potential can be stably taken with respect to the silicon substrate.

(Fourth Embodiment)

Figure 4A:
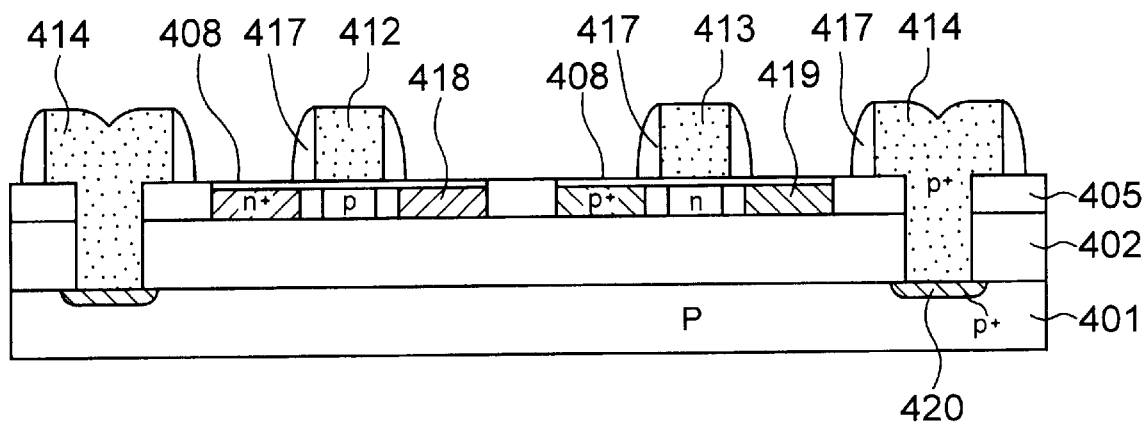
FIG. 4A is a sectional view showing one step of manufacturing the MIS type integrated circuit in a fourth embodiment of the present invention.
Figure 4B:
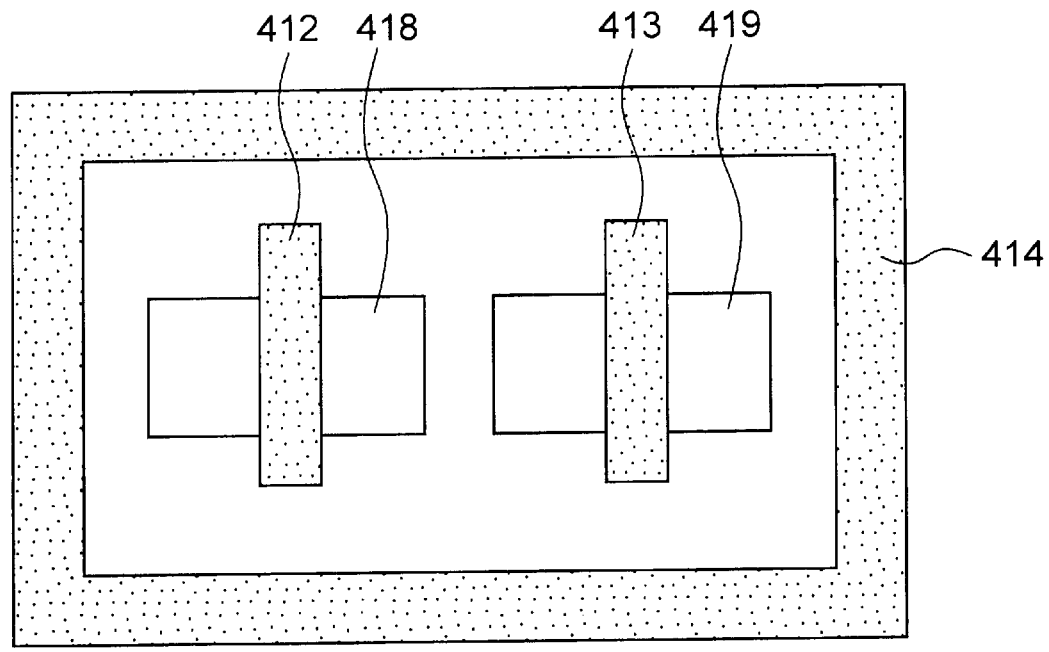
FIG. 4B is a plan view showing one step of manufacturing the MIS type integrated circuit in a fourth embodiment of the present invention.

FIG. 4A is a sectional view showing one step of anufacturing the MIS type integrated circuit in a fourth embodiment of the present invention and FIG. 4B is a plan view showing one step of manufacturing the MIS type integrated circuit in a fourth embodiment of the present invention FIG. 4A is substantially the same as FIG. 1G in the first embodiment, wherein the corresponding components are marked with the reference numerals of 400's.

A difference from the first embodiment is that the substrate electrode is, as shown in FIG. 4B, provided in a ring shape surrounding two pieces of transistors.

As shown in FIG. 4A, an NMOS transistor including a gate electrode 412 and an n-type high-concentration impurity diffused layer 418 and a PMOS transistor including a gate electrode 413 and a p-type high concentration impurity diffused layer 418, are provided on the SOI substrate having a p-type silicon substrate 401. The ions of the p-type impurities are implanted into an electrode 414 in order to provide a p-type high concentration impurity diffused layer 419. The p-type impurities are diffused over within the p-type silicon substrate 401 from the electrode 414 simultaneously with activating the MIS transistor impurities by the thermal process at a high temperature executed thereafter, thereby providing a p-type high concentration diffused layer 420.

The MIS type semiconductor integrated circuit is manufactured by the same other steps as those in the first embodiment.

According to the fourth embodiment, the MIS transistors are surrounded by the substrate electrode in the ring shape, whereby the electric potential distribution is uniformized, the electric potential of the silicon substrate under the MIS transistor can be stabilized, and an influence of external noises on the transistors can be reduced by a shield effect.

Note that the MIS type semiconductor device in the fourth embodiment takes basically the same configuration as that in the first embodiment, thereby exhibiting effects in which the highly reliable contacts can be easily formed, and the electric potential can be stably taken with respect to the silicon substrate.

(Fifth Embodiment)

Figure 5A:
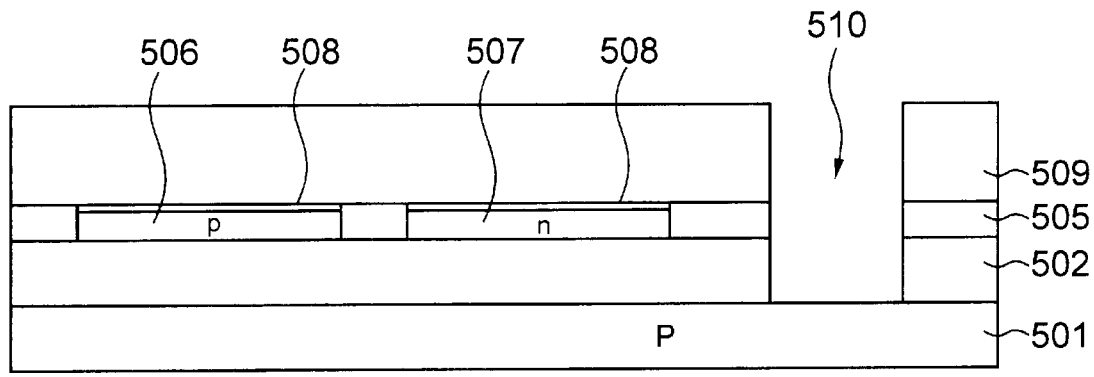
FIGS. 5A and 5B are sectional views of the device, showing one step of manufacturing the MIS type integrated circuit in a fifth embodiment of the present invention.
Figure 5B:
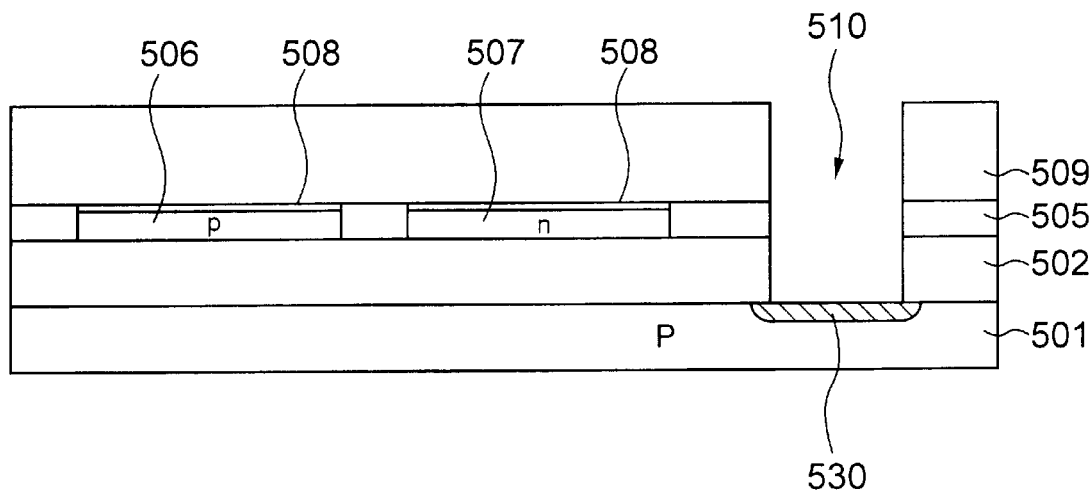

FIGS. 5A and 5B are explanatory views of a device, showing a method of manufacturing the MIS type transistor provided on the SOI substrate in a fifth embodiment of the present invention.

FIG. 5A corresponds to FIG. 1C in the first embodiment, the corresponding components are marked with the reference numerals of 500's replacing 100's in the FIG. 1. A p-type NMOS channel region 506 and an n-type PMOS channel region 507, which are separated by a device isolation region 505, are provided on the SOI substrate including a p-type silicon substrate 501 and an embedded oxide layer 502. Thereafter, an opening 510. Thereafter, an opening 510 penetrating the device isolation oxide layer 505 and the embedded oxide layer 502 and reaching the silicon substrate 501, is formed by the RIE, wherein a resist pattern 509 subjected to the patterning is used as an etching mask. Next, as shown in FIG. 5B, with the same resist pattern 509 used as an ion implantation mask, the ions of the p-type impurities are implanted into the bottom of the opening 510, thereby providing a p-type high concentration diffused layer 530. The impurities in this diffused layer 530 are activated by the thermal process at the high temperature.

Thereafter, the MIS type semiconductor integrated circuit is manufactured by the steps subsequent to the step inclusive shown in FIG. 1D in the first embodiment.

According to the fifth embodiment, the high concentration diffused layer is surely provided ahead on the surface of the silicon substrate 501 via the opening, whereby a contact resistance between the polysilicon electrode provided afterward and the silicon substrate can be reduced.

Note that the basic structure in the fifth embodiment is the same as in the first embodiment, and it is therefore feasible to easily form the highly reliable contacts and similarly exhibit the effect that the electric potential is stably taken for the silicon substrate.

(Sixth Embodiment)

Figure 6A:
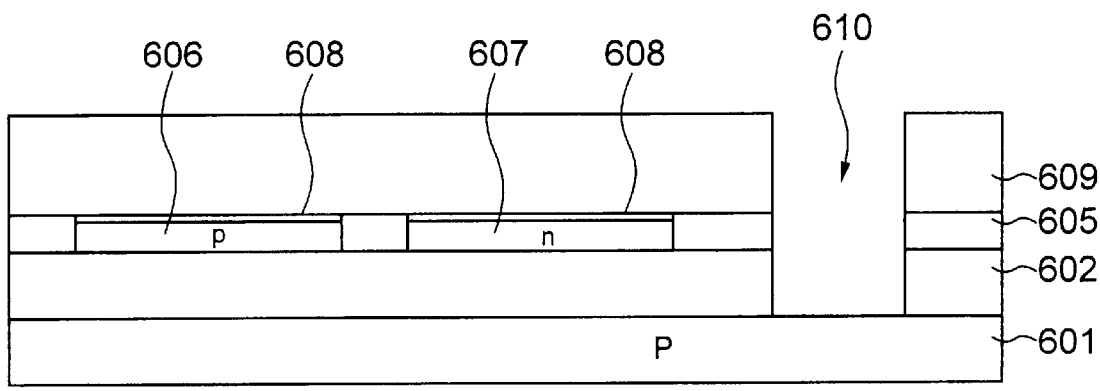
FIGS. 6A through 6C are sectional views of the device, showing one step of manufacturing the MIS type integrated circuit in a sixth embodiment of the present invention.
Figure 6B:
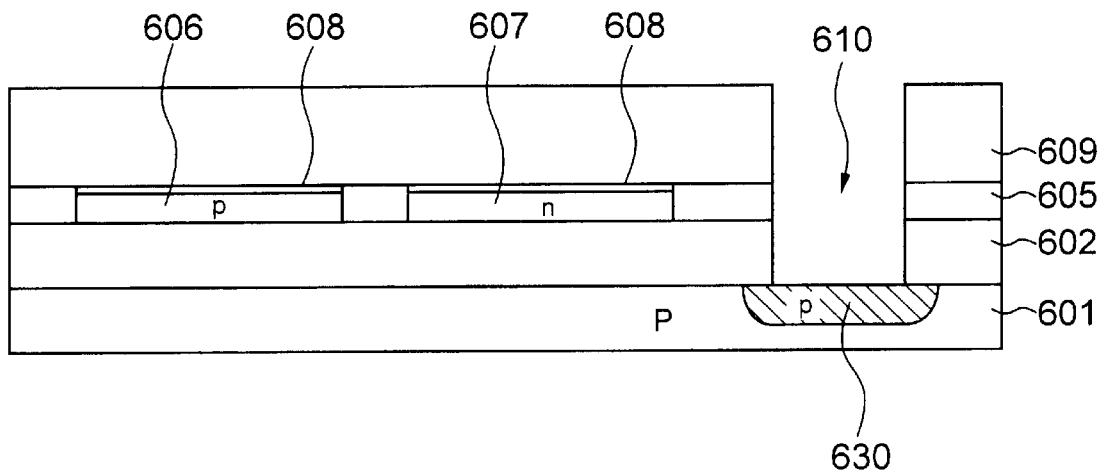
Figure 6C:
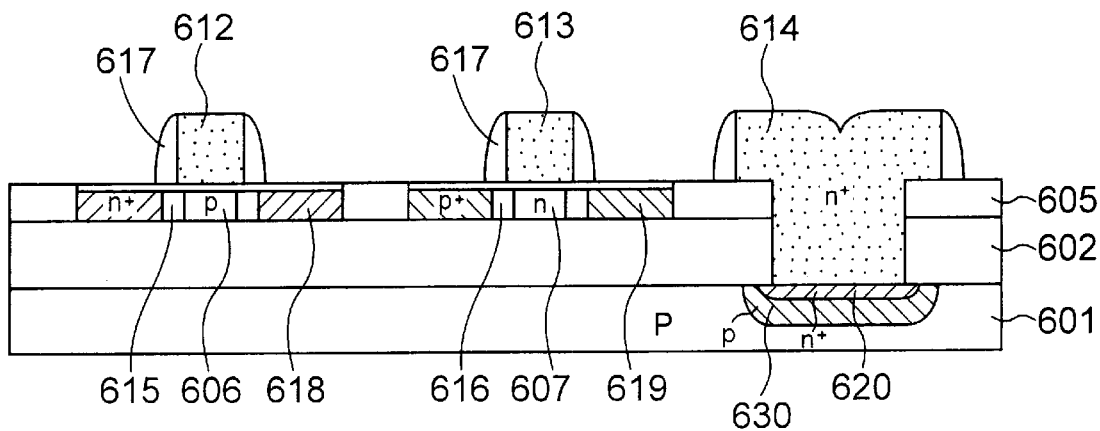

FIGS. 6A to 6C are explanatory sectional views of the device, showing steps of a method of manufacturing the MIS type transistor provided on the SOI substrate in a sixth embodiment of the present invention. The corresponding components in the sixth embodiment are marked with the reference numerals of 600's replacing 100's in the FIG. 1.

FIG. 6A corresponds to FIG. 1C and FIG. 5A, wherein an NMOS channel region 606 and a PMOS channel region 607 are provided, and thereafter an opening 610 penetrating a device isolation oxide layer 605 and an embedded oxide layer 602 and reaching a silicon substrate 601 is formed on the SOI substrate including the P-type silicon substrate 601 and the embedded oxide layer 602.

Next, as shown in FIG. 6B, with the same resist pattern 609 used as an ion implantation mask, the ions of the p-type impurities are implanted into the surface of the silicon substrate 601 provided at the bottom of the opening 610, thereby providing a p-type impurity layer 630.

Subsequently, as explained referring to FIG. 5 in the third embodiment, there are provided an NMOS transistor including a gate electrode 612 and an n-type high-concentration impurity diffused layer 618, and a PMOS transistor having a gate electrode 613 and a p-type high-concentration impurity diffused layer 719. The ions of n-type impurities are implanted also into a substrate electrode 614 in order to provide an n-type high-concentration impurity diffused layer 618, and thereafter the impurities in the MIS transistor are activated by the thermal process at the high temperature. Simultaneously with this activation, the n-type impurities are diffused over within the p-type silicon substrate 601 from the electrode 614, thereby providing an n-type high-concentration diffused layer 620. Note that a concentration of this diffused layer 620 is determined by a relative concentration between the p-type diffused layer 630 and the n-type diffused layer 620.

Thereafter, the MIS semiconductor integrated circuit is manufactured by the steps subsequent to the step inclusive shown in FIG. 1H in the first embodiment.

According to the sixth embodiment, a PN junction having a capacitance or a junction withstand pressure per arbitrary unit area can be formed by adjusting the impurity concentration or distribution of the p-type impurity layer 630. Namely, the impurity concentration of the p-type silicon substrate is as thin as $1E15/cm^3$, and it is therefore possible to obviate such a defect that the deletion layer expands enough not to take a sufficient capacitance.

Note that the basic structure in the sixth embodiment is also the same as in the first embodiment, and hence it is feasible to easily form the highly reliable contacts and similarly exhibit the effect that the electric potential is stably taken for the silicon substrate.

(Seventh Embodiment)

Figure 7A:
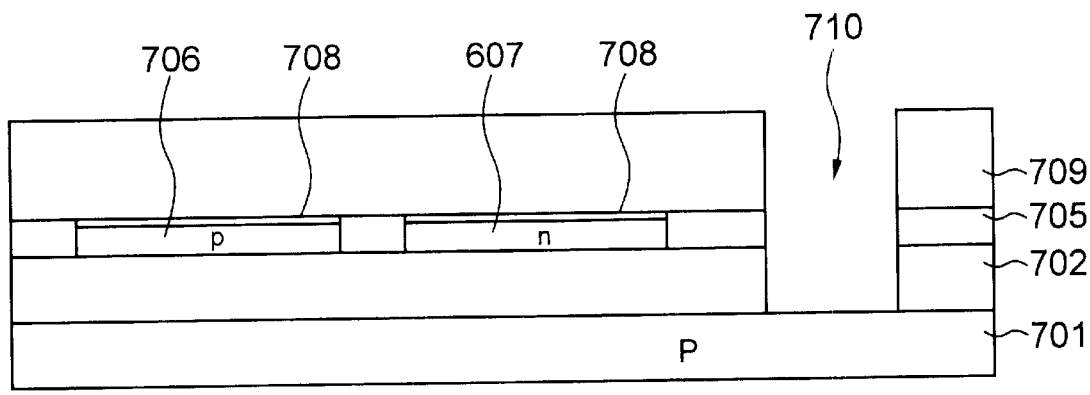
FIGS. 7A through 7C are sectional views of the device, showing one step of manufacturing the MIS type integrated circuit in a seventh embodiment of the present invention.
Figure 7B:
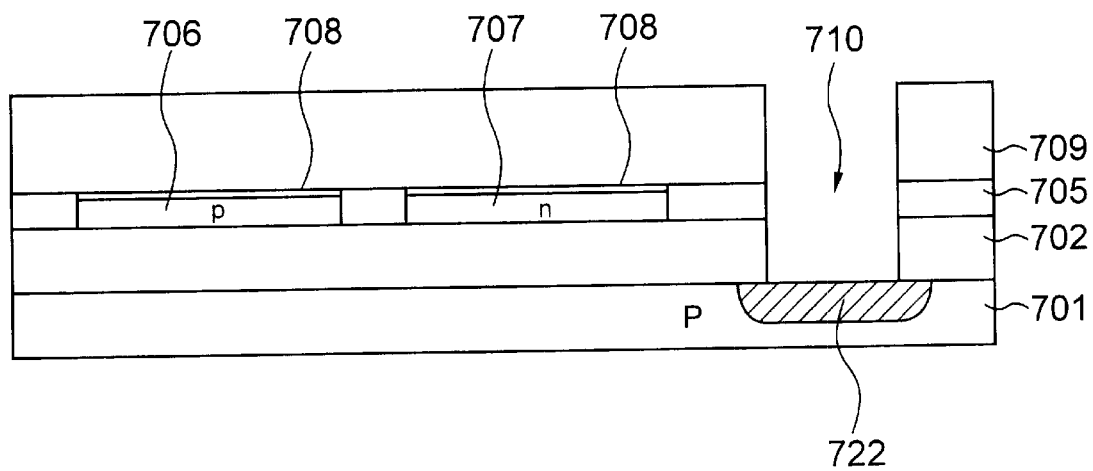
Figure 7C:
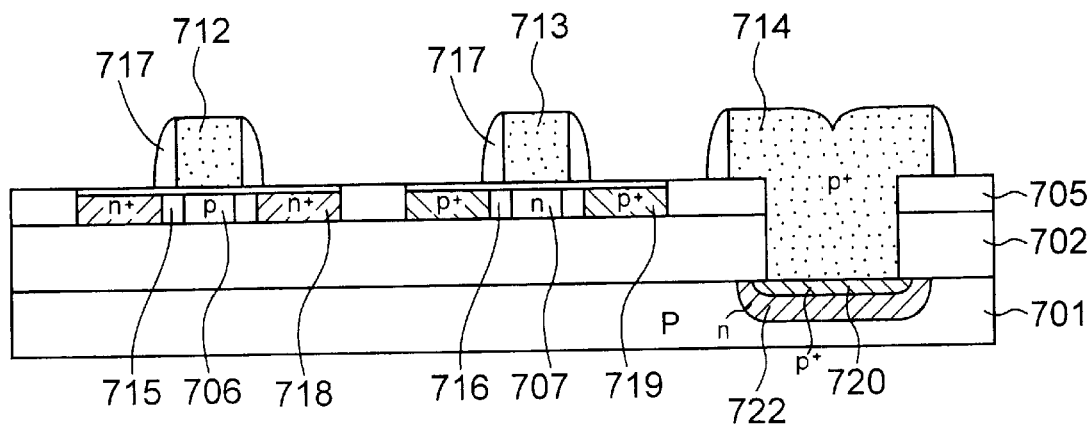

FIGS. 7A to 7C are explanatory sectional views of the device, showing steps of a method of manufacturing the MIS type transistor provided on the SOI substrate in a seventh embodiment of the present invention. what is characteristic of the seventh embodiment is that the conductive type of the substrate electrode is opposite to that in the sixth embodiment shown in FIG. 8.

FIG. 7A corresponds to FIG. 1C and FIG. 6A, wherein an NMOS channel region 706 and a PMOS channel region 707 are provided, and thereafter an opening 710 penetrating a device isolation oxide layer 705 and an embedded oxide layer 702 and reaching a silicon substrate 701 is formed on the SOI substrate including the P-type silicon substrate 701 and the embedded oxide layer 702.

Next, as shown in FIG. 7B, with the same resist pattern 709 used as an ion implantation mask, the ions of the n-type impurities are implanted into the surface of the silicon substrate 701 provided at the bottom of the opening 710, thereby providing an n-type impurity layer 722.

Subsequently, as explained referring to FIG. 5 in the third embodiment, there are provided an NMOS transistor including a gate electrode 712 and an n-type high-concentration impurity diffused layer 718, and a PMOS transistor having a gate electrode 713, a channel region 707 and a p-type high-concentration impurity diffused layer 719. The ions of p-type impurities are implanted also into a substrate electrode 714 in order to provide a p-type high-concentration impurity diffused layer 719, and thereafter the p-type impurities in the MIS transistor are activated by the thermal process at the high temperature. Simultaneously with this activation, the p-type impurities are diffused over within the p-type silicon substrate 701 from the electrode 714, thereby providing a p-type high-concentration diffused layer 720. Note that a concentration of this diffused layer 720 is determined by a relative concentration between the n-type diffused layer 722 and the p-type diffused layer 720.

Thereafter, the MIS semiconductor integrated circuit is manufactured by the steps subsequent to the step inclusive shown in FIG. 1H in the first embodiment.

According to the seventh embodiment, a p+/n junction can be formed on the silicon substrate even in the case of using the p-type silicon substrate and is usable as a passive device.

Note that the basic structure in the seventh embodiment is also the same as in the first embodiment, and hence it is feasible to easily form the highly reliable contacts and similarly exhibit the effect that the electric potential is stably taken for the silicon substrate.

(Eighth Embodiment)

Figure 8A:
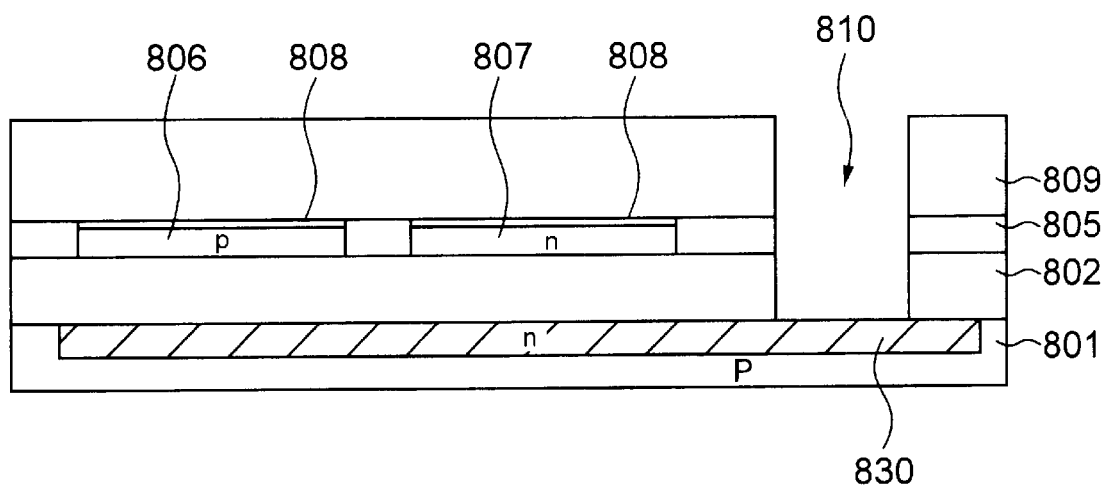
FIGS. 8A and 8B are a sectional view and a plan view showing one step of manufacturing the MIS type integrated circuit in an eighth embodiment of the present invention.
Figure 8B:
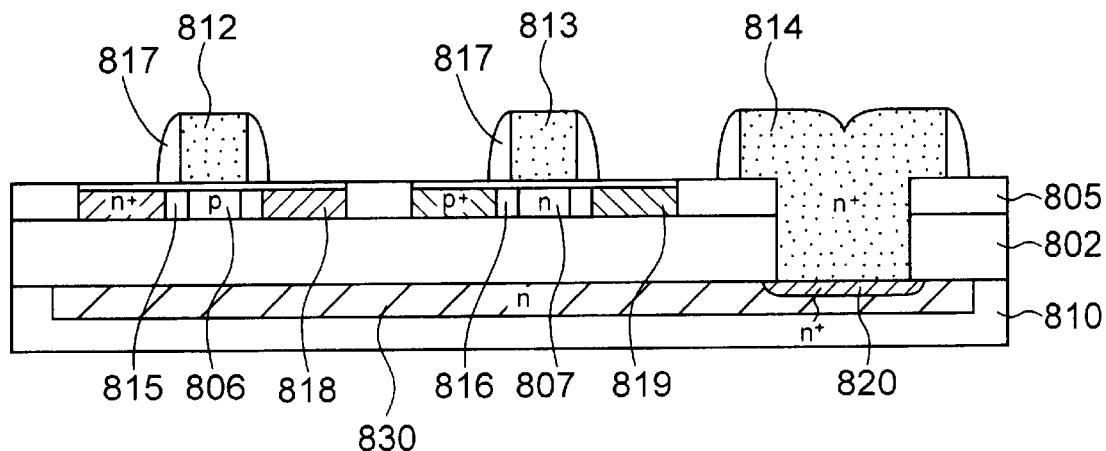

FIGS. 8A and 8B are explanatory sectional views of the device, showing a method of manufacturing the MIS type transistor provided on the SOI substrate in an eighth embodiment of the present invention.

As shown in FIG. 8A, an NMOS channel region 803 and a PMOS channel region 804, which are separated by a device isolation layer 805, are provided on the SOI substrate including a p-type silicon substrate 801 and an embedded oxide layer 802, and thereafter an n-type impurity region 830 is provided on an upper surface of the silicon substrate 801 by executing a high-acceleration ion implantation. Further, an opening 810 penetrating the device isolation oxide layer 805 and the embedded oxide layer 802 and reaching the substrate silicon 801, is formed by the RIE, wherein a resist 809 subjected to the pattering is used as an etching mask.

Subsequently, as shown in FIG. 8B, an NMOS transistor having a gate electrode 812, a channel region 803 and an n-type high-concentration impurity diffused layer 818 and a PMOS transistor having a gate electrode 813, a channel region 804 and a p-type high-concentration impurity diffused layer 819, are provided by the same manufacturing method exemplified in the third embodiment. The ions of the n-type impurities are implanted into also a substrate electrode 814 for providing the n-type high-concentration impurity diffused layer 818. Simultaneously with the activation of the impurities in the MIS transistor, the n-type impurities are diffused over within the n-type impurity region 830 from the electrode 814 by the thermal process at the high temperature effected afterward, thereby providing the n-type high-concentration diffused layer 820.

According to the eighth embodiment, a capacitance junction between the n-type substrate electrode 814, the n-type impurity layer 830 provided on the surface of the silicon substrate and the channel regions 806, 807, enables the electric potential of the substrate under the transistor to modulate, whereby a characteristic of the transistor can be changed. Moreover, the substrate electrode 814 and the impurity region 830 are provided for every transistor, thereby making it possible to modulate the characteristic of the individual transistor.

Note that the basic structure in the eighth embodiment is also the same as in the first embodiment, and hence it is feasible to easily form the highly reliable contacts and similarly exhibit the effect that the electric potential is stably taken for the silicon substrate.

(Ninth Embodiment)

Figure 9:
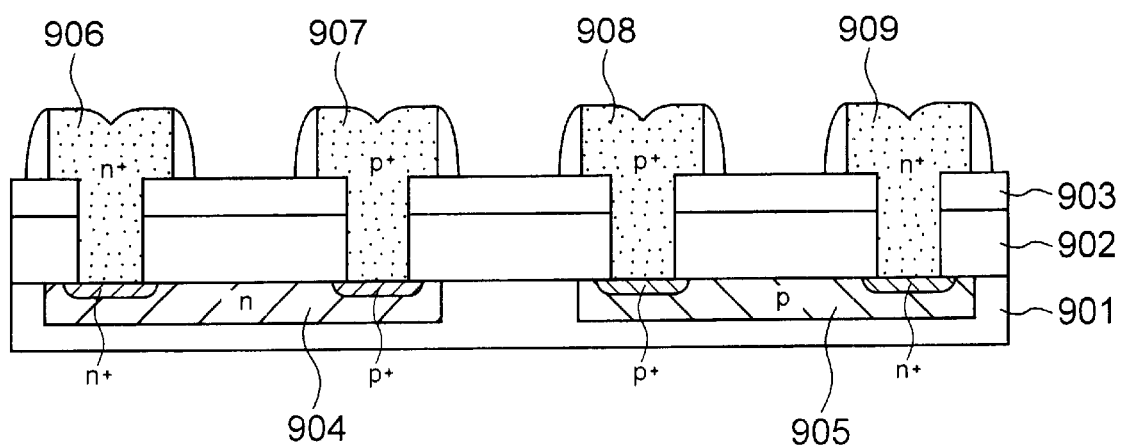
FIG. 9 is a sectional view showing one step of manufacturing the MIS type integrated circuit in a ninth embodiment of the present invention.

FIG. 9 is an explanatory sectional view of the device, showing the MIS type transistor provided on the SOI substrate in a ninth embodiment of the present invention.

The ninth embodiment is a modified example of the eighth embodiment illustrated in FIGS. 8A and 8B, wherein only the components related to the substrate electrode are shown, and the reference numerals in FIG. 9 are not related directly to those in FIGS. 1A through 8B.

On the SOI substrate having a p-type silicon substrate 901 and an embedded oxide layer 902, an n-type impurity region 904 and a p-type impurity region 905 are provided inside a silicon substrate 901, and an NMOS transistor (not shown) and a PMOS transistor (unillustrated), n-type substrate electrodes 906, 909 and p-type substrate electrodes 907, 908, are provided by the same manufacturing method exemplified in the first, third and eighth embodiments.

As obvious from FIG. 9, an $n^+$/p-type diode is composed of the electrodes 906, 907 and the impurity layer 904, and a $p^+$/n-type diode is composed of the electrodes 908, 909 and the impurity layer 905, and hence a variety of applications can be made.

The subsequent steps are carried out by the manufacturing method exemplified in the first embodiment.

Figure 10:
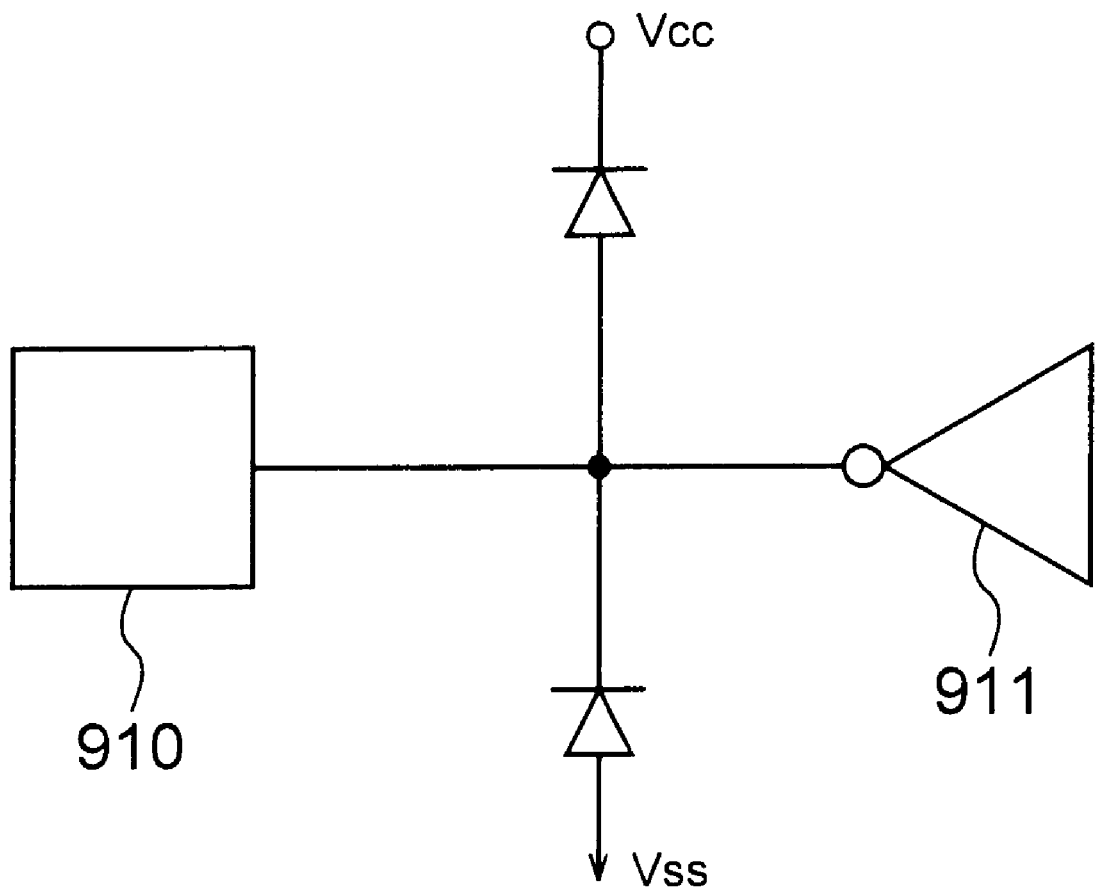
FIG. 10 is a circuit diagram showing a protection diode obtained by the substrate electrode shown in FIG. 9.
Figure 11A:
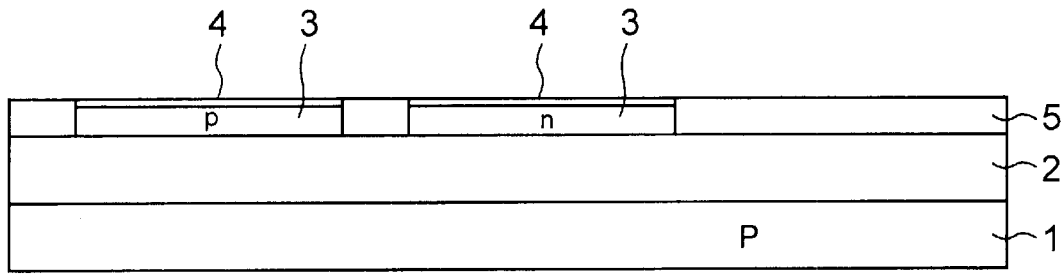
FIGS. 11A through 11G are sectional views showing respective steps of manufacturing a conventional MIS type integrated circuit.
Figure 11B:
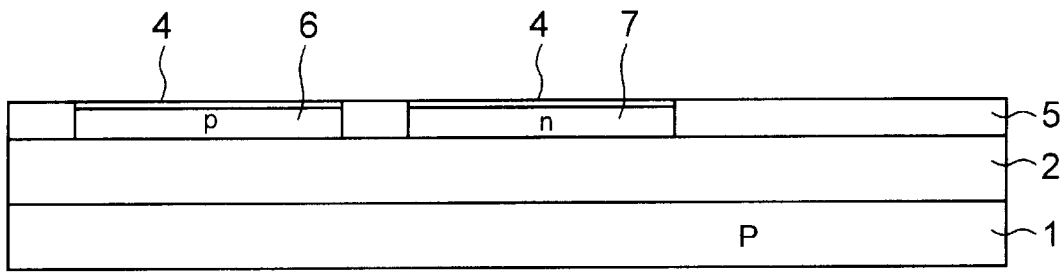
Figure 11C:
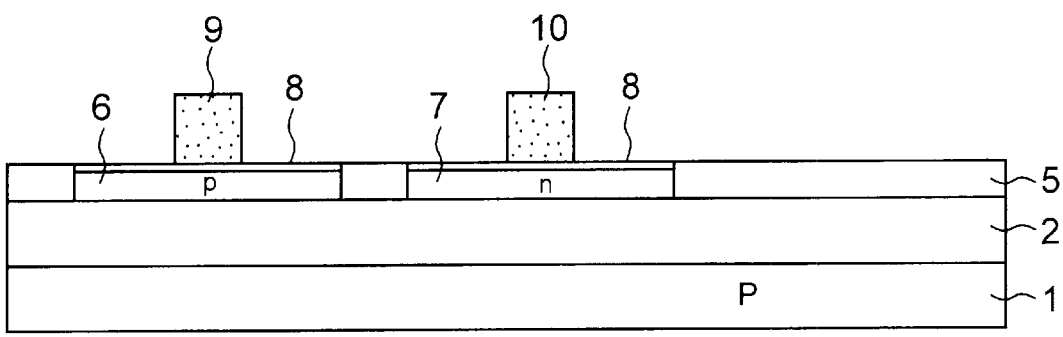
Figure 11D:
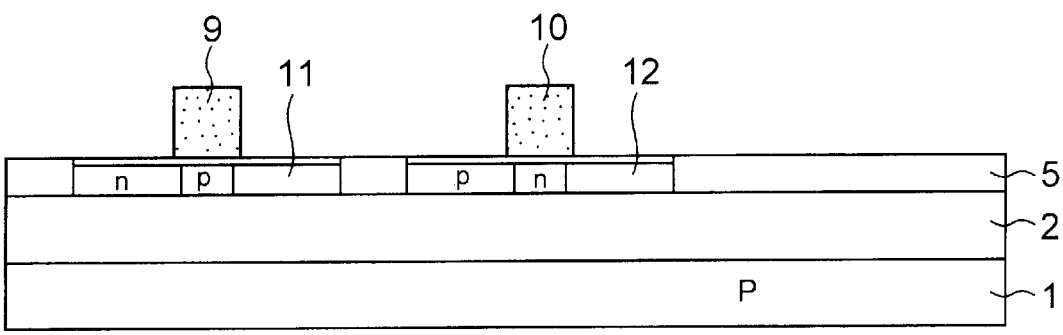
Figure 11E:
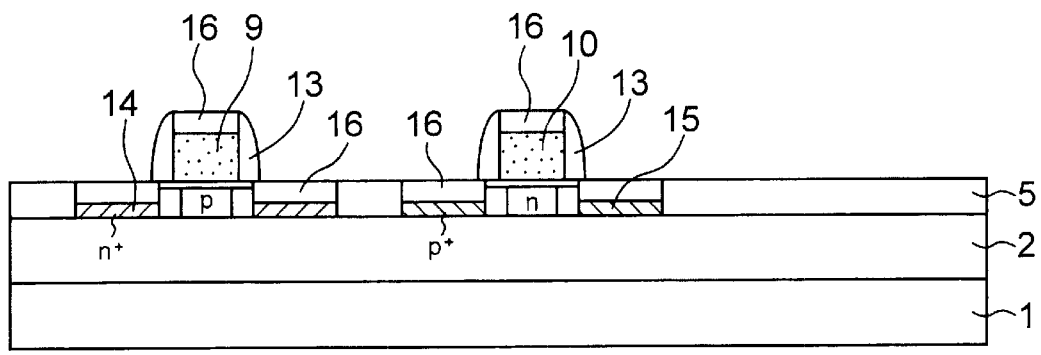
Figure 11F:
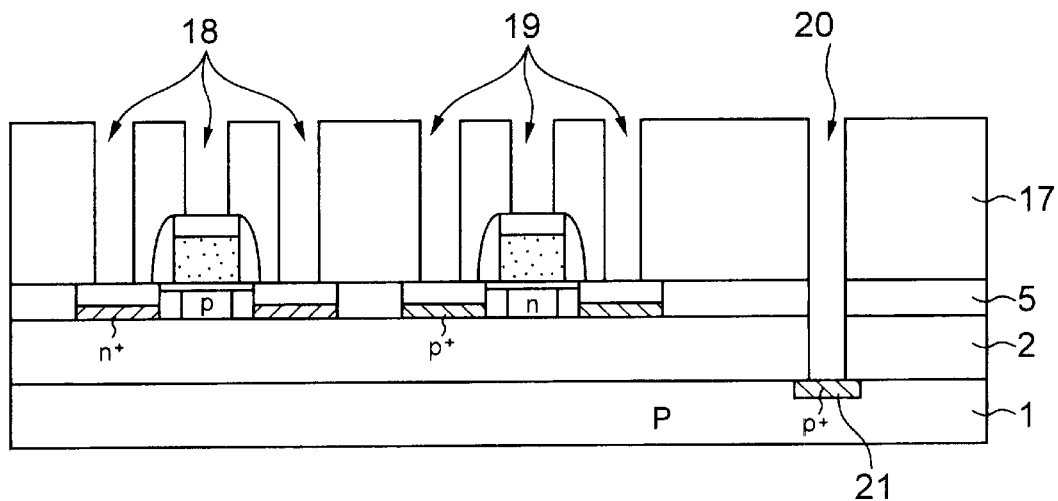
Figure 11G:
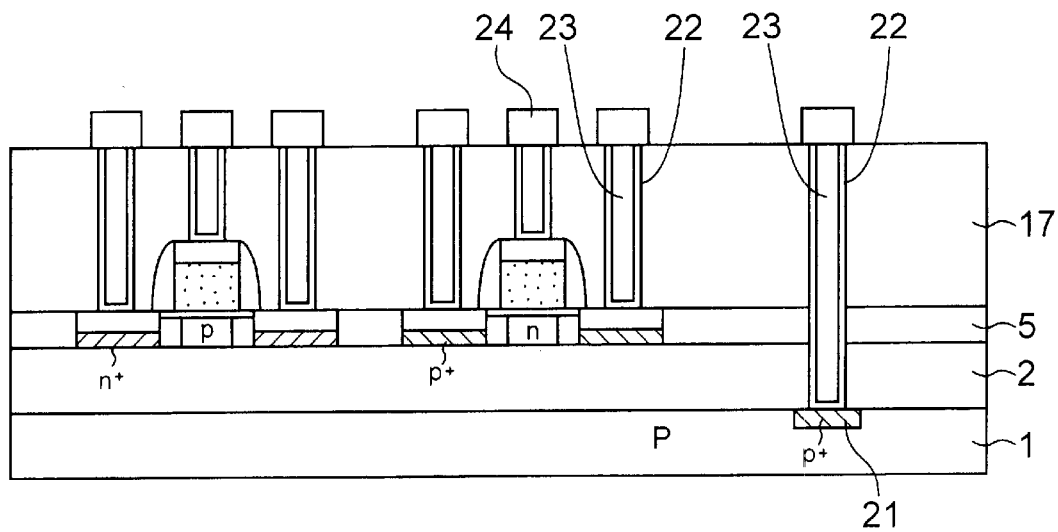

FIG. 10 is a diagram illustrating in a circuit version the structure shown in FIG. 9. As shown in FIG. 10, the $n^+$/p diode and the $p^+$/n diode are inserted in between an I/O buffer 911 at the first stage and an external pad 910 constituting an integrated circuit, and function as an I/O protection circuit.

In the case of configuring the integrated circuit by use of the structure according to the ninth embodiment, a size of the substrate electrode can be set arbitrary. It is therefore feasible to form an electrostatic protection diode having a large junction area that was hard to configure in the conventional MIS type integrated circuit on the SOI substrate.

Note that the components excluding the substrate electrode are the same as those in the preceding embodiments, and it is therefore feasible to easily form the highly reliable contacts and to similarly exhibit the effect that the electric potential can be stably taken for the silicon substrate.

In the respective embodiments discussed above, the configurations, the manufacturing conditions etc. other than the materials and the characteristic portions can be properly changed without departing from the concept of the present invention.

As discussed above, the semiconductor device according to embodiments of the present invention includes the SOI substrate formed with the mono-crystalline semiconductor layer through the embedded insulating layer on the first conductivity type semiconductor substrate, the MIS type field-effect transistor provided within the device region defined by isolating the mono-crystalline semiconductor layer with the device isolation region and having the gate electrode, the opening formed penetrating the device isolation region and the embedded insulating layer and reaching the semiconductor substrate, and the substrate electrode provided covering the opening and taken out up to the surface flush with the gate electrode. Hence, the contact hole formed thereafter comes to have the same aspect ratio as that for the gate electrode, and the sure and stable electric connection can be attained.

Further, the opening is formed ahead, and it is therefore possible to complete the formations of the impurity layers for the electric connection to the semiconductor substrate and the activation as well before forming the metal silicide of the MIS transistor, and to take the electric connection to the semiconductor substrate.

Moreover, the semiconductor device having the protection diode according to embodiments of the present invention can be obtained by previously providing the impurity diffused layer on the surface of the semiconductor substrate, and providing the plurality of substrate electrodes doped with the impurities having the conductivity types opposite to each other.

The method of manufacturing the semiconductor device according to embodiments of the present invention includes the step of providing the device isolation region for defining the device region on the mono-crystalline semiconductor layer of the SOI substrate formed with the mono-crystalline semiconductor layer through the embedded insulation payer on the semiconductor substrate, the step of forming the opening penetrating the device isolation region and the embedded insulation layer and reaching the semiconductor substrate, the step of depositing the polysilicon on the SOI substrate and within the opening and providing the gate electrode and the substrate electrode of the MIS type field-effect transistor by executing the patterning thereon, and the step of implanting the impurities into this substrate electrode. The take-out of the substrate potential is done by the easy-to-form substrate electrode, and the contact hole to the substrate electrode has the same aspect ratio as that with respect to the gate electrode, whereby the highly reliable semiconductor device can be stably easily manufactured.

The discussions on the various embodiments have been made, however, the present invention is not limited to these embodiments and various variations and alternatives can be similarly applied to.

What is claimed is:

1. A semiconductor device comprising:
   an SOI substrate formed with a mono-crystalline semiconductor layer through an embedded insulating layer on a first conductivity type semiconductor substrate;
   a MIS type field-effect transistor provided within a device region defined by isolating said mono-crystalline semiconductor layer with a device isolation region and having a gate electrode;
   an opening formed penetrating said device isolation region and said embedded insulating layer and reaching said semiconductor substrate; and
   a substrate electrode provided covering said opening and taken out up to a surface flush with said gate electrode, said substrate electrode being formed to surround said MIS type field-effect transistor;
   wherein a surface of said semiconductor substrate just under said MIS field-effect transistor is provided with an impurity diffused layer having a same conductivity type as that of said polysilicon electrode.

2. The semiconductor device according to claim 1, wherein said substrate electrode is a polysilicon electrode diffused with a first conductivity type impurity, and
   a first conductivity type impurity diffused layer corresponding to said polysilicon electrode is formed in said semiconductor substrate.

3. The semiconductor device according to claim 1, wherein said device region has a second conductivity type MIS type field-effect transistor forming region having a first conductivity type channel impurity region, and a first conductivity type MIS type field-effect transistor forming region having a second conductivity type channel impurity region, and there are provided substrate electrodes of polysilicon diffused with the first and second conductivity impurities corresponding to said first conductivity type and said second conductivity type MIS type field-effect transistors.

4. A semiconductor device as in claim 1, wherein a depth of said opening to obtain a potential of said semiconductor substrate is equal to a depth of a contact opening for said gate electrode.

5. A semiconductor device as in claim 1, wherein an aspect ratio of a contact hole with respect to said substrate electrode is less than or equal to an aspect ratio of said gate electrode.

6. A semiconductor device comprising:
   an SOI substrate configured by providing a mono-crystalline semiconductor layer through an embedded insulation layer on a first conductivity type semiconductor substrate of which the surface is provided with a first impurity diffused layer of the first conductivity type and a second impurity diffused layer of a second conductivity type, said first impurity diffused layer being insulated from said second impurity diffused layer;
   first and second MIS field-effect transistors respectively provided in proximity of said first impurity diffused layer and said second impurity diffused layer within a device region defined by isolating said mono-crystalline semiconductor layer with a device isolation region, and each having a gate electrode;
   first and second openings penetrating said device isolation region and said embedded insulation layer and reaching said first impurity diffused layer of said semiconductor substrate;
   third and fourth openings penetrating said device isolation region and said embedded insulation layer and reaching said second impurity diffused layer of said semiconductor substrate;
   first and fourth polysilicon substrate electrodes of the first conductivity type, configured to fill and cover said first and fourth openings, and taken out up to the surface flush with said gate electrode; and
   second and third polysilicon substrate electrodes of the second conductivity type, configured to fill and cover said second and third openings, and taken out up to the surface flush with said gate electrode,
   wherein a first diode for electrostatic protection is composed by said first polysilicon substrate electrode, said first impurity diffused layer and said second polysilicon substrate electrode, and a second diode for electrostatic protection is composed by said third polysilicon substrate electrode, said second impurity diffused layer and said fourth polysilicon substrate electrode.

* * * * *